(12) United States Patent
Zhang et al.

(10) Patent No.: US 11,974,431 B2
(45) Date of Patent: Apr. 30, 2024

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Zhong Zhang, Hubei (CN); Wenyu Hua, Hubei (CN); Zhiliang Xia, Hubei (CN)

(73) Assignee: Yangtze Memory Technologies Co., Ltd., Hubei (CN)

(*) Notice: Subject to any disclaimer, the term of this patent is extended or adjusted under 35 U.S.C. 154(b) by 0 days.

(21) Appl. No.: 17/353,260

(22) Filed: Jun. 21, 2021

(65) Prior Publication Data

US 2021/0313351 A1 Oct. 7, 2021

Related U.S. Application Data

(60) Division of application No. 16/458,401, filed on Jul. 1, 2019, now Pat. No. 11,069,705, which is a
(Continued)

(51) Int. Cl.
*H01L 29/792* (2006.01)
*H01L 21/033* (2006.01)
(Continued)

(52) U.S. Cl.
CPC ......... *H10B 43/27* (2023.02); *H01L 21/0335* (2013.01); *H01L 21/0337* (2013.01); *H10B 41/27* (2023.02); *H10B 43/50* (2023.02)

(58) Field of Classification Search
CPC .......... H01L 27/11582; H01L 21/0337; H01L 27/11556; H01L 27/11575;
(Continued)

(56) References Cited

U.S. PATENT DOCUMENTS 8,748,970 B1 * 6/2014 Lee .................. H01L 27/11575
257/324
9,362,226 B2 6/2016 Lee et al.
(Continued)

FOREIGN PATENT DOCUMENTS

CN 104900648 A 9/2015
CN 105074923 A 11/2015
(Continued)

OTHER PUBLICATIONS

International Search Report and Written Opinion of the International Searching Authority directed to related International Patent Application No. PCT/CN2019/076139, dated Mar. 29, 2019; 8 pages.

*Primary Examiner* — Caleb E Henry
*Assistant Examiner* — Dilinh P Nguyen
(74) *Attorney, Agent, or Firm* — Sterne, Kessler, Goldstein & Fox P.L.L.C.

(57) ABSTRACT

The present disclosure provides a method for forming a three-dimensional memory device. The method can comprise forming a film stack with a plurality of dielectric layer pairs on a substrate, forming a channel structure region in the film stack including a plurality of channel structures, and forming a first staircase structure in a first staircase region and a second staircase structure in a second staircase region. Each of the first staircase structure and the second staircase structure can include a plurality of division block structures arranged along a first direction. A first vertical offset defines a boundary between adjacent division block structures. Each division block structure includes a plurality of staircases arranged along a second direction that is different from the first direction. Each staircase includes a plurality of steps arranged along the first direction.

20 Claims, 10 Drawing Sheets

Related U.S. Application Data continuation of application No. PCT/CN2019/076139, filed on Feb. 26, 2019.

(51) Int. Cl.
*H10B 41/27* (2023.01)
*H10B 43/27* (2023.01)
*H10B 43/50* (2023.01)

(58) Field of Classification Search
CPC ......... H01L 27/11548; H01L 27/11519; H01L 27/11565
USPC ........................................................ 257/324
See application file for complete search history.

(56) References Cited

U.S. PATENT DOCUMENTS

| | | | |
|---|---|---|---|
| 10,109,325 B2 | 10/2018 | Tanzawa | |
| 10,141,331 B1 | 11/2018 | Susuki et al. | |
| 10,461,030 B2 | 10/2019 | Hwang et al. | |
| 10,790,295 B2 | 9/2020 | Zhao et al. | |
| 10,840,183 B2 | 11/2020 | Yun et al. | |
| 11,069,705 B2 | 7/2021 | Zhang et al. | |
| 2010/0144133 A1 | 6/2010 | Nomura et al. | |
| 2016/0322376 A1 | 11/2016 | Lee | |
| 2017/0040381 A1 | 2/2017 | Chen et al. | |
| 2017/0179025 A1* | 6/2017 | Yun ..................... | H01L 23/5283 |
| 2017/0256551 A1 | 9/2017 | Lee | |
| 2018/0240805 A1* | 8/2018 | Yun ..................... | H01L 29/7926 |
| 2018/0331034 A1 | 11/2018 | Thimmegowda et al. | |
| 2019/0051664 A1* | 2/2019 | Baek ..................... | H10B 43/30 |
| 2020/0051983 A1 | 2/2020 | Zhang et al. | |
| 2020/0273875 A1 | 8/2020 | Zhang et al. | |

FOREIGN PATENT DOCUMENTS

| | | |
|---|---|---|
| CN | 107731847 A | 2/2018 |
| CN | 107818983 A | 3/2018 |
| CN | 108550574 A | 9/2018 |
| CN | 109155317 A | 1/2019 |
| CN | 109155318 A | 1/2019 |
| JP | 2014-138188 A | 7/2014 |
| JP | 2017-112363 A | 6/2017 |

\* cited by examiner

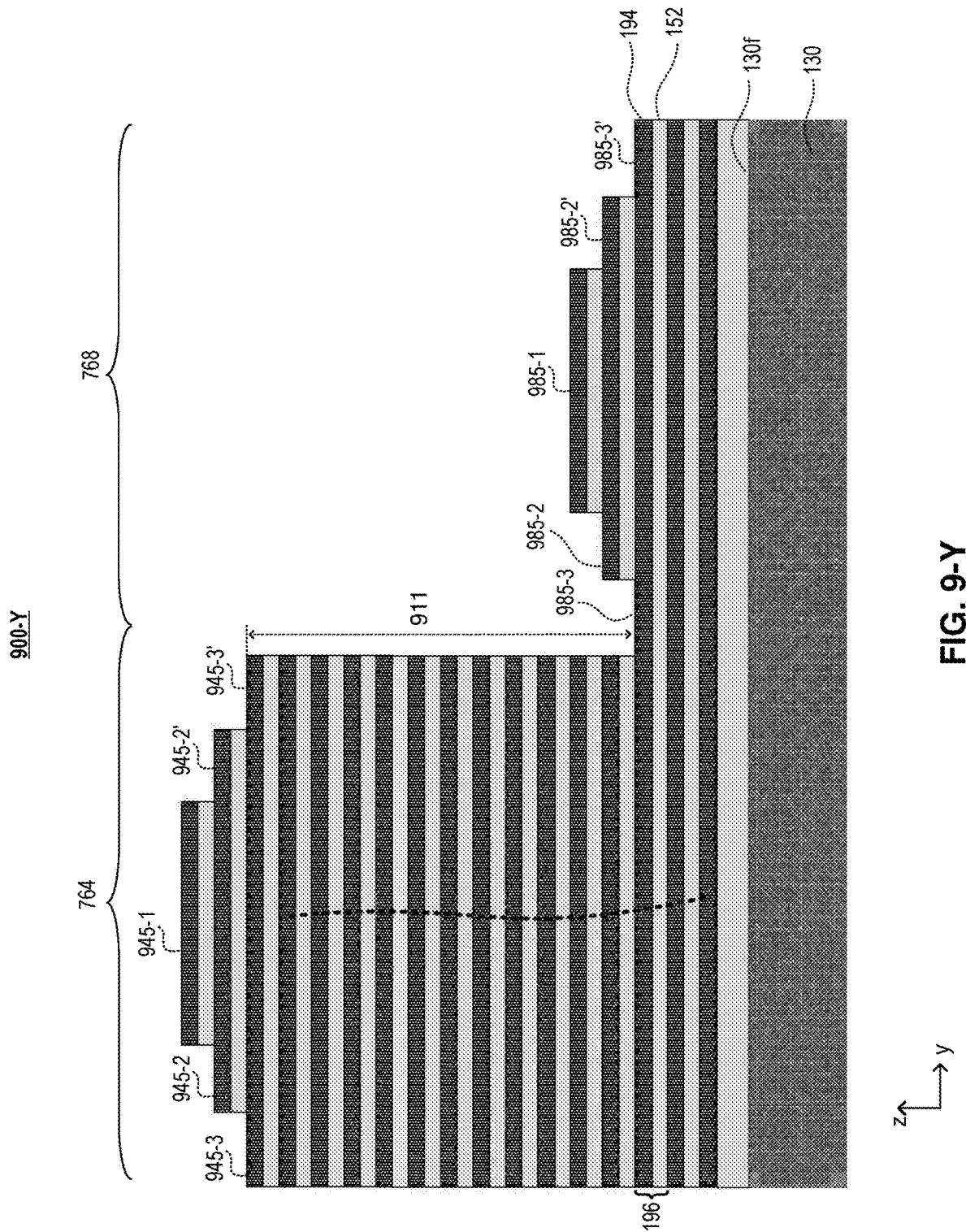
FIG. 9-Y

THREE-DIMENSIONAL MEMORY DEVICES AND FABRICATING METHODS THEREOF

CROSS-REFERENCE TO RELATED APPLICATIONS

This application is a divisional application of U.S. patent application Ser. No. 16/458,401, filed on Jul. 1, 2019, which claims priority to PCT Application No. PCT/CN2019/076139, filed on Feb. 26, 2019, which are incorporated herein by references in their entirety.

TECHNICAL FIELD

The present disclosure generally relates to the field of semiconductor technology, and more particularly, to three-dimensional (3D) memory devices and fabrication methods thereof.

BACKGROUND

Planar memory cells are scaled to smaller sizes by improving process technology, circuit designs, programming algorithms, and the fabrication process. However, as feature sizes of the memory cells approach a lower limit, planar process and fabrication techniques become challenging and costly. As such, memory density for planar memory cells approaches an upper limit.

A 3D memory architecture can address the density limitation in planar memory cells. 3D memory architecture includes a memory array and peripheral devices for controlling signals to and from the memory array. A typical 3D memory architecture includes a stack of gate electrodes arranged over a substrate, with a plurality of semiconductor channels through and intersecting word lines into the substrate. The intersection of a word line and a semiconductor channel forms a memory cell.

The 3D memory architecture requires an electrical contact scheme to allow the control of each individual memory cells. One electrical contact scheme is to form a staircase structure to connect to word lines of each individual memory cells. Staircase structures have been used to connect more than 32 word lines along a semiconductor channel in a typical 3D memory device.

As semiconductor technology advances, 3D memory devices, such as 3D NAND memory devices, keep scaling more oxide/nitride (ON) layers. As a result, the existing multi-cycle etch and trim processes used to form such staircase structures suffer a low throughput and are expensive.

BRIEF SUMMARY

Embodiments of contact structures for three-dimensional memory devices and methods for forming the same are described in the present disclosure.

One aspect of the present disclosure provides a three-dimensional (3D) memory device, comprising: a channel structure region including a plurality of channel structures; a first staircase structure in a first staircase region including a plurality of division block structures arranged along a first direction on a first side of the channel structure, and a second staircase structure in a second staircase region including a plurality of division block structures arranged along the first direction on a second side of the channel structure. A first vertical offset defines a boundary between adjacent division block structures. Each division block structure includes a plurality of staircases arranged along a second direction that is different from the first direction. Each staircase includes a plurality of steps arranged along the first direction.

In some embodiments, the 3D memory device further comprises a top select gate staircase structure including a number $X_2$ of steps arranged along the second direction in the channel structure region.

In some embodiments, a second vertical offset between the plurality of division block structures in the first staircase region and the plurality of division block structures in the second staircase region equals to $X_2$ times a thickness of one step.

In some embodiments, a third vertical offset between adjacent staircases equals to $2X_2$ times the thickness of one step.

In some embodiments, each staircase includes a number $(2X_2-1)$ of steps distributed symmetrically in $X_2$ levels.

In some embodiments, the first staircase structure and the first staircase structure include a plurality of dielectric/conductive layer pairs; and each step includes a dielectric/conductive layer pair.

In some embodiments, the first direction and the second direction are perpendicular to each other and are in a plane parallel to an interface surface of the dielectric/conductive layer pair.

In some embodiments, a number of the plurality of division block structures in each of the first staircase region and the second staircase region is $X_1$; and a number of the plurality of staircases in each division block structure is $X_3$.

In some embodiments, the first vertical offset between adjacent of division block structures equals to $2X_2X_3$ times a thickness of one step.

In some embodiments, a total number of the plurality of steps in the first staircase structure and the second staircase structure is $2X_1(2X_2-1)X_3$; and the plurality of steps are distributed in a number of $2X_1X_2X_3$ different levels.

In some embodiments, $X_1$ is two and $X_2$ is three.

Another aspect of the present disclosure provides a method for forming a three-dimensional (3D) memory device, comprising: forming a film stack with a plurality of dielectric layer pairs on a substrate; forming a channel structure region in the film stack including a plurality of channel structures; and forming a first staircase structure in a first staircase region and a second staircase structure in a second staircase region, each of the first staircase structure and the second staircase structure including a plurality of division block structures arranged along a first direction. A first vertical offset defines a boundary between adjacent division block structures, and each division block structure includes a plurality of staircases arranged along a second direction that is different from the first direction. Each staircase includes a plurality of steps arranged along the first direction.

In some embodiments, the method further comprises forming a top select gate staircase structure including a number $X_2$ of steps arranged along the second direction in the channel structure region.

In some embodiments, forming the first staircase structure and the second staircase structure includes: forming a plurality of initial division step structures in the first staircase region and the second staircase region, each initial division step structure including the number $X_2$ of steps arranged along the first direction, wherein each step includes a dielectric layer pair.

In some embodiments, forming the plurality of initial division step structures includes: disposing a first staircase division pattern mask with a number $2X_1$ of first division block patterns on the film stack; and using an etch-trim process based on the first staircase division pattern mask to form the plurality of initial division step structures.

In some embodiments, forming the first staircase structure and the second staircase structure further includes: forming a number $X_3$ of staircases in each of the initial division step structures to form a number $X_1$ of division block structures in each of the first staircase region and the second staircase region.

In some embodiments, forming the staircases includes: using an etch-trim process such that the staircases are formed along the second direction. The first direction and the second direction are perpendicular to each other and are in a plane parallel to an interface surface of the dielectric/conductive layer pair.

In some embodiments, an etching depth in each cycle of the etch-trim process is $2X_2$ times a thickness of one step.

In some embodiments, forming the first staircase structure and the second staircase structure further includes: disposing a second staircase division pattern mask to cover at least two division block structures and expose at least two division block structures; and etching the exposed at least two division block structures by a depth equal to $2X_2X_3$ times the thickness of one step.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
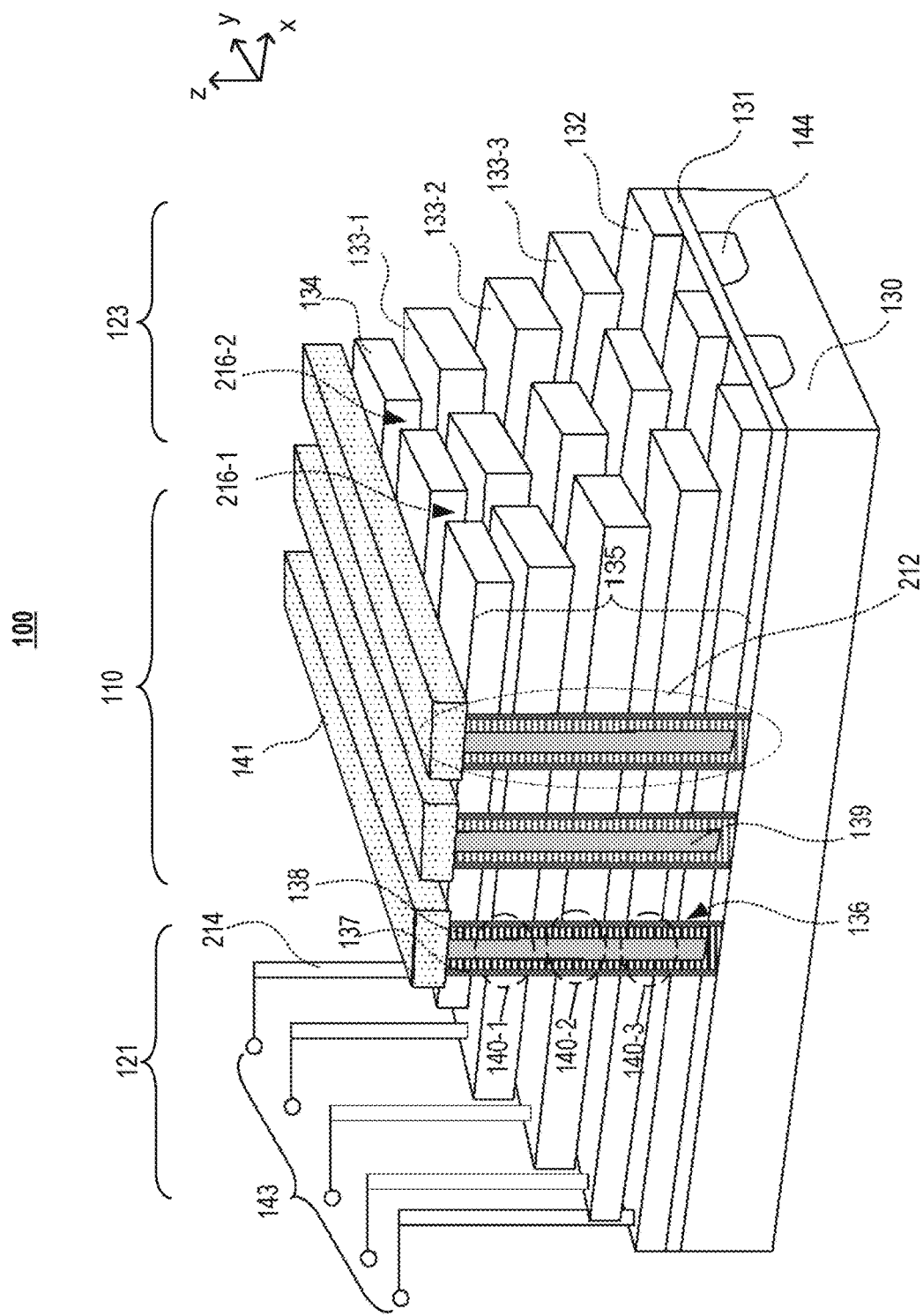
FIG. 1 illustrates a perspective view of a portion of an exemplary three-dimensional (3D) memory array structure in accordance with some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or 30% of the value).

In the present disclosure, the term "horizontal/horizontally/lateral/laterally" means nominally parallel to a lateral surface of a substrate. In the present disclosure, the term "each" may not only necessarily mean "each of all," but can also mean "each of a subset."

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

In some embodiments, a memory string of a 3D memory device includes a semiconductor pillar (e.g., silicon channel) that extends vertically through a plurality of conductive and dielectric layer pairs. The plurality of conductive and dielectric layer pairs are also referred to herein as an "alternating conductive and dielectric stack." An intersection of the conductive layer and the semiconductor pillar can form a memory cell. The conductive layer of the alternating conductive and dielectric stack can be connected to a word line at the back-end-of-line, wherein the word line can electrically connect to one or more control gates. For illustrative purposes, word lines and control gates are used interchangeably to describe the present disclosure. The top of the semiconductor pillar (e.g., transistor drain region) can be connected to a bit line (electrically connecting one or more semiconductor pillars). Word lines and bit lines are typically laid perpendicular to each other (e.g., in rows and columns, respectively), forming an "array" of the memory, also called a memory "block" or an "array block".

A memory "die" may have one or more memory "planes", and each memory plane may have a plurality of memory blocks. An array block can also be divided into a plurality of memory "pages", wherein each memory page may have a plurality of memory strings. In a flash NAND memory device, erase operation can be performed for every memory block and read/write operation can be performed for every memory page. The array blocks are the core area in a memory device, performing storage functions. To achieve higher storage density, the number of vertical 3D memory stacks is increased greatly, adding complexity and cost in manufacturing.

A memory die has another region, called the periphery, which provides supporting functions to the core. The periphery region includes many digital, analog, and/or mixed-signal circuits, for example, row and column decoders, drivers, page buffers, sense amplifiers, timing and controls, and the like circuitry. Peripheral circuits use active and/or passive semiconductor devices, such as transistors, diodes, capacitors, resistors, etc., as would be apparent to a person of ordinary skill in the art.

In 3D memory device architectures, memory cells for storing data are vertically stacked to form a stacked storage structure. 3D memory devices can include a staircase structure formed on one or more sides of the stacked storage structure for purposes such as word line fan-out, where the stacked storage structure includes a plurality of semiconductor channels, where the semiconductor channels can be vertical or horizontal. As the demand for higher storage capacity continues to increase, the number of vertical levels of the stacked storage structure also increases. Accordingly, a thicker mask layer, such as photoresists (PR) layer, is needed to etch the staircase structure with increased levels. However, the increase of thickness of the mask layer can make the etch control of the staircase structure more challenging.

In the present disclosure, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. Each of the horizontal surfaces is referred as a "step" or "staircase" of the staircase structure. In the present disclosure, a horizontal direction can refer to a direction (e.g., the x-axis or the y-axis) parallel with a top surface of the substrate (e.g., the substrate that provides the fabrication platform for formation of structures over it), and a vertical direction can refer to a direction (e.g., the z-axis) perpendicular to the top surface of the structure.

A staircase structure can be formed from a dielectric stack layer by repetitively etching the dielectric stack layer using a mask layer formed over the dielectric stack layer. In some embodiments, the mask layer can include a photoresist (PR) layer. In the present disclosure, the dielectric stack layer includes a plurality of alternatively arranged dielectric layer pairs, and the thickness of each dielectric layer pair is one level. In other words, each of the dielectric layer pair is one level high vertically. In the present disclosure, term "step" refers to one level of a staircase structure, and term "staircase" refers to two or more levels of a staircase structure. A step (or staircase) exposes a portion of a surface of a dielectric layer pair. In some embodiments, each dielectric layer pair includes a first material layer and a second material layer. In some embodiments, the first material layer includes an insulating material layer. In some embodiments, the second material includes a sacrificial material layer which is to be replaced by a conductive material layer. In some embodiments, each dielectric layer pair can have nominally the same height over the substrate so that one set can form one step.

During the formation of the staircase structure, the mask layer is trimmed (e.g., etched incrementally and inwardly from the boundary of the dielectric stack layer) and used as the etch mask for etching the exposed portion of the dielectric stack. The amount of trimmed mask layer can be directly relevant (e.g., determinant) to the dimensions of the staircases. The trimming of the mask layer can be obtained using a suitable etch, e.g., an isotropic dry etch or a wet etch. One or more mask layers can be formed and trimmed consecutively for the formation of the staircase structure. Each dielectric layer pair can be etched, after the trimming of the mask layer, using suitable etchants to remove a portion of both the first material layer and the second material layer.

In some embodiments, the formed staircase structure can include multiple division block structures each including multiple staircases, and each staircase can include multiple steps. The multiple division block structures, multiple staircases, and multiple steps can be arranged along different directions. As such, the 3D space of the staircase structure can be efficiently used to form a large number of steps. During the fabricating process of the disclosed staircase structure can reduce a thickness of masks to be used, a number of masks to be used, and a number of trimming processes, thereby increasing a number of etching wafers per hour (WPH).

After the formation of the staircase structure, the mask layer can be removed. In some embodiments, the second material layers are conductive material layers, and therefore can be gate electrodes (or word lines) of the 3D memory structure. In some embodiments, the second material layers of the staircase structure are sacrificial material layers and can then be replaced with metal/conductor layers (e.g., tungsten) to form the gate electrodes (or word lines) of the 3D memory structure. As such, the multiple dielectric layer pairs can become dielectric/conductive layer pairs.

The staircase structure can provide an interconnection scheme as word line fan-out to control the semiconductor channels after an interconnect formation process. Each of the dielectric/conductive layer pairs in the staircase structure intersect to a portion of a semiconductor channel. Each of the conductive material layers in the staircase structure can control the portion of the semiconductor channel. An example of an interconnect formation process includes disposing or otherwise depositing, a second insulating material, such as silicon oxide, spin-on-dielectric, or borophosphosilicate glass (BPSG), over the staircase structure and planarizing the second insulating material. Each of the conductive material layers in the staircase structure is exposed to open a plurality of contact holes in the planarized second insulating material and the contact holes are filled with one or more conductive materials, such as titanium nitride and tungsten, to form a plurality of VIA (Vertical Interconnect Access) structures.

Other parts of the memory devices are not discussed for ease of description. In the present disclosure, a "memory device" is a general term and can be a memory chip (package), a memory die or any portion of a memory die.

Although using three-dimensional NAND devices as examples, in various applications and designs, the disclosed structures can also be applied in similar or different semiconductor devices to, e.g., to improve metal connections or wiring. The specific application of the disclosed structures should not be limited by the embodiments of the present disclosure.

FIG. 1 illustrates a perspective view of a portion of an exemplary three-dimensional (3D) memory array structure 100, in accordance with some embodiments. The memory array structure 100 includes a substrate 130, an insulating film 131 over the substrate 130, a tier of lower select gates (LSGs) 132 over the insulating film 131, and a plurality of tiers of control gates 133, also referred to as "word lines (WLs)," stacking on top of the LSGs 132 to form a film stack 135 of alternating conductive and dielectric layers. The dielectric layers adjacent to the tiers of control gates 133 are not shown in FIG. 1 for clarity.

The control gates 133 of each tier are separated by slit structures 216-1 and 216-2 through the film stack 135. The memory array structure 100 also includes a tier of top select gates (TSGs) 134 over the stack of control gates 133. The stack of TSG 134, control gates 133 and LSG 132 is also referred to as "gate electrodes." The memory array structure 100 further includes doped source line regions 144 in portions of substrate 130 between adjacent LSGs 132. The memory array structure 100 can include a channel structure region 110 and two staircase regions 121, 123 on both sides of the channel structure region 110. The channel structure region 110 can include an array of memory strings 212, each including a plurality of stacked memory cells 140.

Each memory strings 212 includes a channel hole 136 extending vertically through the insulating film 131 and the film stack 135 of alternating conductive and dielectric layers. Memory strings 212 also includes a memory film 137 on a sidewall of the channel hole 136, a channel layer 138 over the memory film 137, and a core filling film 139 surrounded by the channel layer 138. A memory cell 140 can be formed at the intersection of the control gate 133 and the memory string 212. The memory array structure 100 further includes a plurality of bit lines (BLs) 141 connected to the memory strings 212 over the TSGs 134.

The memory array structure 100 also includes a plurality of metal interconnect lines 143 connected to the gate electrodes through a plurality of contact structures 214. In the two staircase regions 121 and 123, the edge of the film stack 135 is configured in a staircase structure to allow an electrical connection to each tier of the gate electrodes. In some embodiments, a staircase structure can include a set of horizontal surfaces (e.g., along x-y plane) that have distances among each other in the vertical direction (e.g., along z-axis, or z-direction). For illustrative purposes, FIG. 1 only shows that the steps are configured along x-direction to gradually decrease the heights of the horizontal surfaces along z-direction. It is noted that, multiple steps in the staircase regions 121 and 123 can be configured in both x-direction and y-direction to increase and/or decrease the heights of the horizontal surfaces along z-direction. An exemplary configuration of multiple steps in staircase regions 121 and 123 will be further described in details below in connection with the following figures.

It is also noted that, in FIG. 1, for illustrative purposes, three tiers of control gates 133-1, 133-2, and 133-3 are shown together with one tier of TSG 134 and one tier of LSG 132. In this example, each memory string 212 can include three memory cells 140-1, 140-2 and 140-3, corresponding to the control gates 133-1, 133-2 and 133-3, respectively. In some embodiments, the number of control gates and the number of memory cells can be more than three to increase storage capacity. The memory array structure 100 can also include other structures, for example, through array contact, TSG cut, common source contact and dummy channel structure. These structures are not shown in FIG. 3 for simplicity.

With the demand for higher storage capacity in a NAND flash memory, the number of vertical tiers of 3D memory cells 140 or word lines 133 increases accordingly, leading to more process complexity and higher manufacturing cost. When increasing the tiers of memory cells 140 or word lines 133 of the memory array structure 100, it becomes more challenging to form multiple steps in one direction in the staircase structures and also more challenging to form contact structures 214 on the staircase structures.

For example, to form the contact structures 214 on a large number of vertically stacked word lines (gate electrodes), a high aspect ratio etching is needed to form contact holes. During prolonged high aspect ratio etching, the critical dimension (CD) of the contact holes on the lower level of the staircase structure can be much larger than the CD of contact holes on the top level of the staircase structure. In addition, profile of contact holes on the lower level of the staircase structure can have large bowing. Large CD bias and bowing profile among contact structures not only creates memory performance variation due to metal loading difference, but may also cause yield loss due to electrical shorts between neighboring contact structures.

As another example, in some existing memory array structure, one of the two staircase regions 121 and 123 is normally used as a dummy staircase region, which is not used for memory cell gate connection. That is, the multiple contact holes are formed in only one of the two staircase regions 121 and 123. Thus, the unitization efficiency of the staircase structures is only 50%. Further, using only one of the two staircase regions 121 and 123 reduces the division structure in y-direction of the staircase structure by half, resulting in more required masks.

Figure 2:
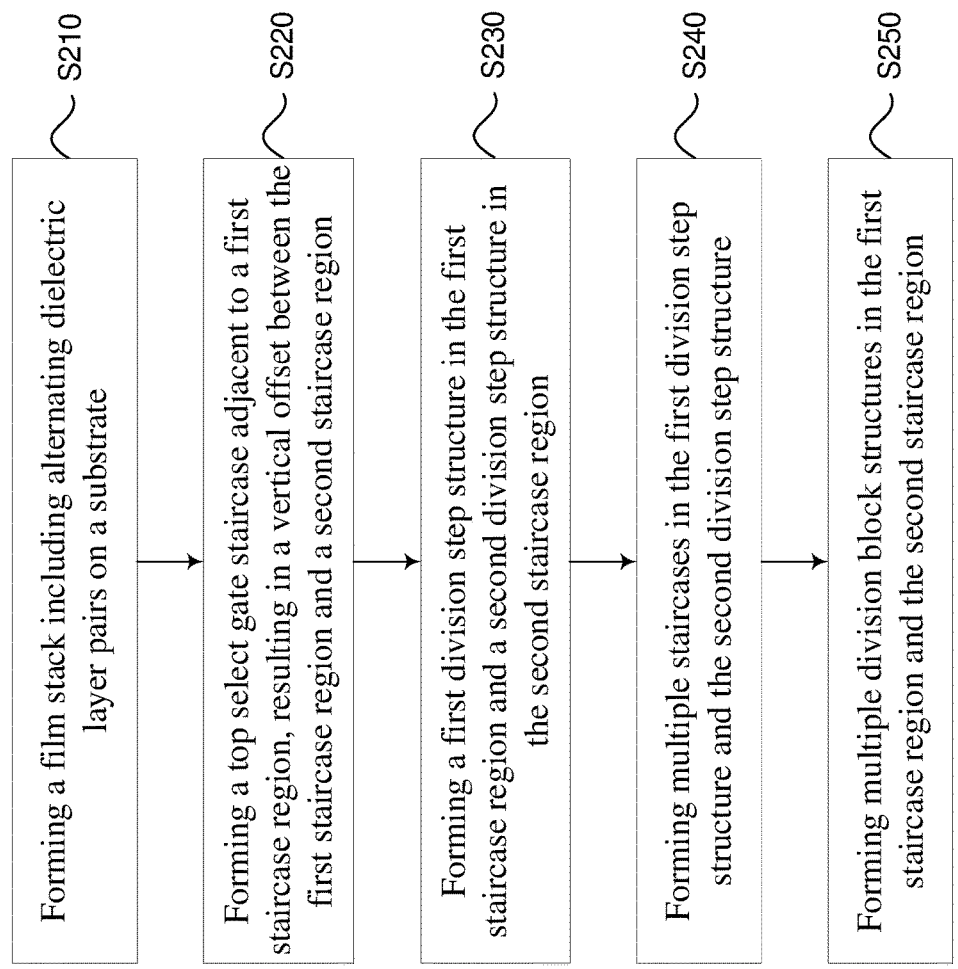
FIG. 2 illustrates a flow diagram of an exemplary method for forming a 3D memory device including staircase structures with multiple divisions in accordance with some embodiments.

Therefore, in the present disclosure, staircase structures with multiple divisions and fabrication methods thereof for a 3D memory device are disclosed to address the above challenges. Referring to FIG. 2, a flow diagram of an exemplary method 200 for forming a 3D memory device including staircase structures with multiple divisions is illustrated in accordance with some embodiments. The process operations shown in method 200 are not exhaustive and other process operations can be performed as well before, after, or between any of the illustrated process operations. In some embodiments, some process operations of exemplary method 200 can be omitted or include other process operations that are not described here for simplicity. In some embodiments, process operations of method 200 can be performed in a different order and/or vary. FIGS. 3-9 illustrate schematic views of various structures of an exemplary 3D memory device at certain fabricating stages of the method 200 shown in FIG. 2, according to some embodiments of the present disclosure.

Figure 3:
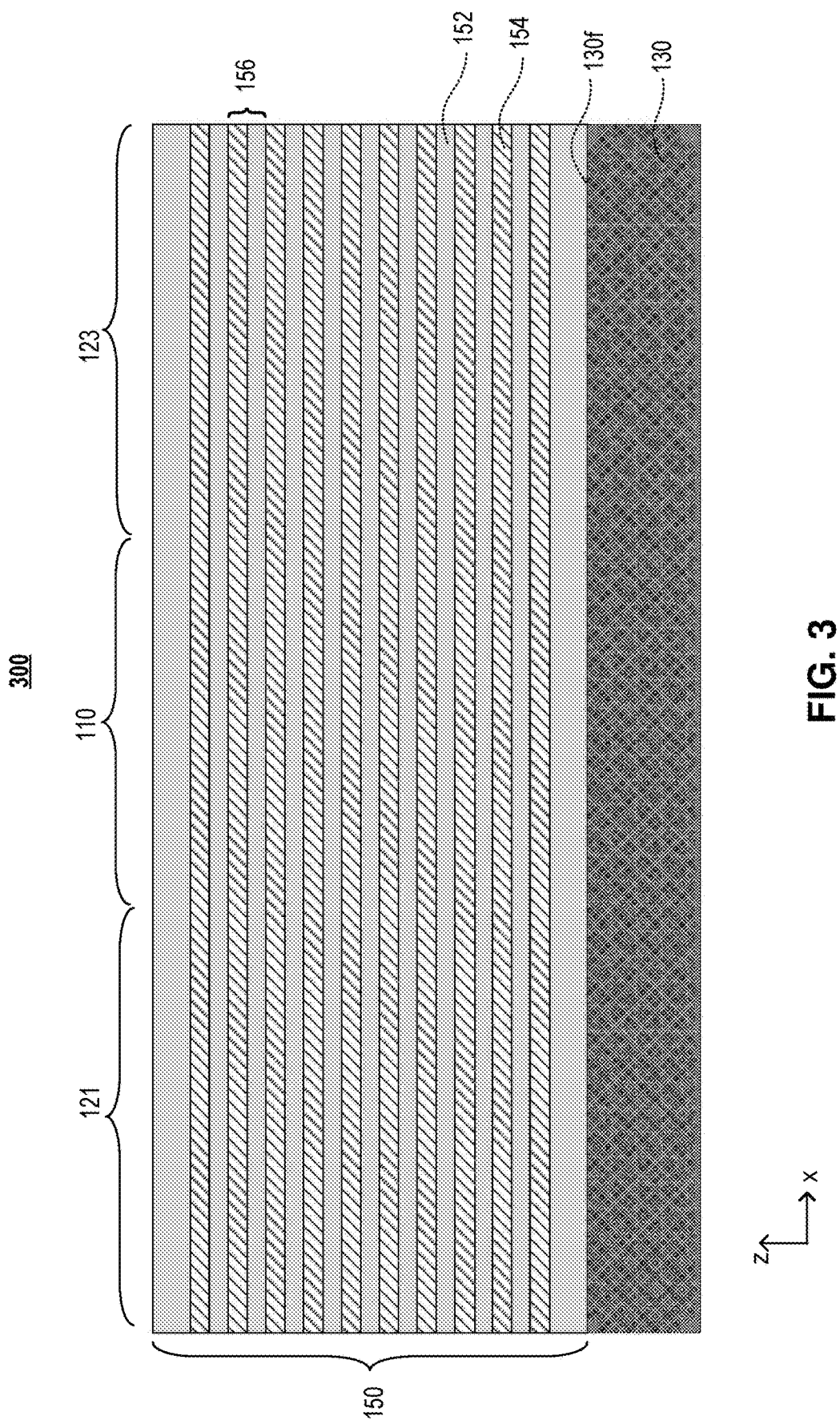
FIG. 3 illustrates a cross-sectional view of an exemplary structure of a 3D memory device in accordance with some embodiments.

As shown in FIG. 2, method 200 can start at S210, in which a film stack including multiple alternating dielectric layer pairs can be disposed on a substrate. FIG. 3 illustrates a cross-sectional view of an exemplary structure 300 of a 3D memory device, according to some embodiments, wherein the structure 300 includes a substrate 130 and a film stack 150. The cross-sectional view of FIG. 2 is along WL direction (or x-direction) in FIG. 1.

The substrate 130 can provide a platform for forming subsequent structures. In some embodiments, the substrate 130 can be any suitable semiconductor substrate having any suitable structure, such as a monocrystalline single-layer silicon substrate, a polycrystalline silicon (polysilicon) single-layer substrate, a polysilicon and metal multi-layer substrate, etc. The substrate 130 can include any other suitable material, for example, silicon germanium, silicon carbide, silicon on insulator (SOI), germanium on insulator (GOI), glass, gallium nitride, gallium arsenide, III-V compound, and/or any combinations thereof.

A front surface 130$f$ of the substrate 130 is also referred to as a "main surface" or a "top surface" of the substrate herein. Layers of materials can be disposed on the front surface 130$f$ of the substrate. A "topmost" or "upper" layer is a layer farthest or farther away from the front surface 130$f$ of the substrate. A "bottommost" or "lower" layer is a layer closest or closer to the front surface 130$f$ of the substrate. In some embodiments, the substrate 130 can further include an insulating film on the front surface 130$f$.

The film stack 150 extends in a lateral direction that is parallel to the front surface 130$f$ of the substrate 130. The film stack 150 includes a dielectric layer 152 (also referred to as "first dielectric layer") and a sacrificial layer 154 (also referred to as "second dielectric layer") alternatingly stacked on each other, wherein the dielectric layer 152 can be configured to be the bottommost and the topmost layers of the film stack 150. In this configuration, each sacrificial layer 154 can be sandwiched between two dielectric layers 152, and each dielectric layer 152 can be sandwiched between two sacrificial layers 154 (except the bottommost and the topmost layer).

The dielectric layer 152 and the underlying sacrificial layer 154 are also referred to as an alternating dielectric layer pair 156. The formation of the film stack 150 can include disposing the dielectric layers 152 to each have the same thickness or to have different thicknesses. Example thicknesses of the dielectric layers 152 can range from 10 nm to 500 nm. Similarly, the sacrificial layer 154 can each have the same thickness or have different thicknesses. Example thicknesses of the sacrificial layer 154 can range from 10 nm to 500 nm. Although only 21 total layers are illustrated in the film stack 150 in FIG. 3, it should be understood that this is for illustrative purposes only and that any number of layers may be included in the film stack 150. In some embodiments, the film stack 150 can include layers in addition to the dielectric layer 152 and the sacrificial layer 154, and can be made of different materials and with different thicknesses.

In some embodiments, the dielectric layer 152 includes any suitable insulating materials, for example, silicon oxide, silicon oxynitride, silicon nitride, TEOS or silicon oxide with F-, C-, N-, and/or H-incorporation. The dielectric layer 152 can also include high-k dielectric materials, for example, hafnium oxide, zirconium oxide, aluminum oxide, tantalum oxide, or lanthanum oxide films. The formation of the dielectric layer 152 on the substrate 130 can include any suitable deposition methods such as, chemical vapor deposition (CVD), physical vapor deposition (PVD), plasmaenhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

In some embodiments, the sacrificial layer 154 includes any suitable material that is different from the dielectric layer 152 and can be removed selectively. For example, the sacrificial layer 154 can include silicon oxide, silicon oxynitride, silicon nitride, TEOS, poly-crystalline silicon, poly-crystalline germanium, poly-crystalline germanium-silicon, and any combinations thereof. In some embodiments, the sacrificial layer 154 also includes amorphous semiconductor materials, such as amorphous silicon or amorphous germanium. The sacrificial layer 154 can be disposed using a similar technique as the dielectric layer 152, such as CVD, PVD, ALD, thermal oxidation or nitridation, or any combination thereof.

In some embodiments, the sacrificial layer 154 can be replaced by a conductive layer, wherein the conductive layer can include any suitable conductive material, for example, poly-crystalline silicon, poly-crystalline germanium, poly-crystalline germanium-silicon, or any combination thereof. In some embodiments, the conductive layer can also include amorphous semiconductor materials, such as amorphous silicon, amorphous germanium or any combination thereof. In some embodiments, the poly-crystalline or amorphous material of the conductive layer can be incorporated with any suitable type of dopant, such as boron, phosphorous, or arsenic, to increase the conductivity of the material. The formation of the conductive layer can include any suitable deposition methods such as, CVD, RTCVD, PECVD, LPCVD, MOCVD, HDP-CVD, PVD, ALD or any combination thereof. In some embodiments, poly-crystalline semiconductor material can be deposited in an amorphous state and converted to poly-crystalline through subsequent thermal treatments. In some embodiments, the dopants in the conductive layer can be incorporated through in-situ doping as the poly-crystalline or amorphous semiconductor material being deposited, by simultaneously flowing chemical gas, for example, diborane ($B_2H_6$) or phosphine ($PH_3$). Other doping techniques for 3D structure, such as plasma doping, can also be used to increase conductivity of the conductive layer. In some embodiments, after dopant incorporation, a high temperature annealing process can be performed to active the dopants in the conductive layer. In some embodiments, the dielectric layer 152 can be silicon oxide and the conductive layer can be poly-crystalline silicon. In the present disclosure, the sacrificial layer 154 is illustrated as an example. However, a person skilled in the art can replace the sacrificial layer 154 with the conductive layer for the structures and methods described below.

In some embodiments, along the x-direction as shown in FIG. 3, the structure 300 of the 3D memory device can include a channel structure region 110 and two staircase regions 121, 123 on both sides of the channel structure region 110. The channel structure region 110 can be used for forming an array of memory strings each including a plurality of stacked memory cells, as described above in connection with FIG. 1. The two staircase regions 121 and 123 can be used for forming a staircase structure in the subsequent processes described in details below. It is noted that, for illustrative purpose, the width of the channel structure region 110 is less than the widths of the two staircase regions 121 and 123 in FIG. 3. However, the dimension relationship between different components as shown in FIG. 3 does not limit the scope of the present disclosure.

Figure 4:
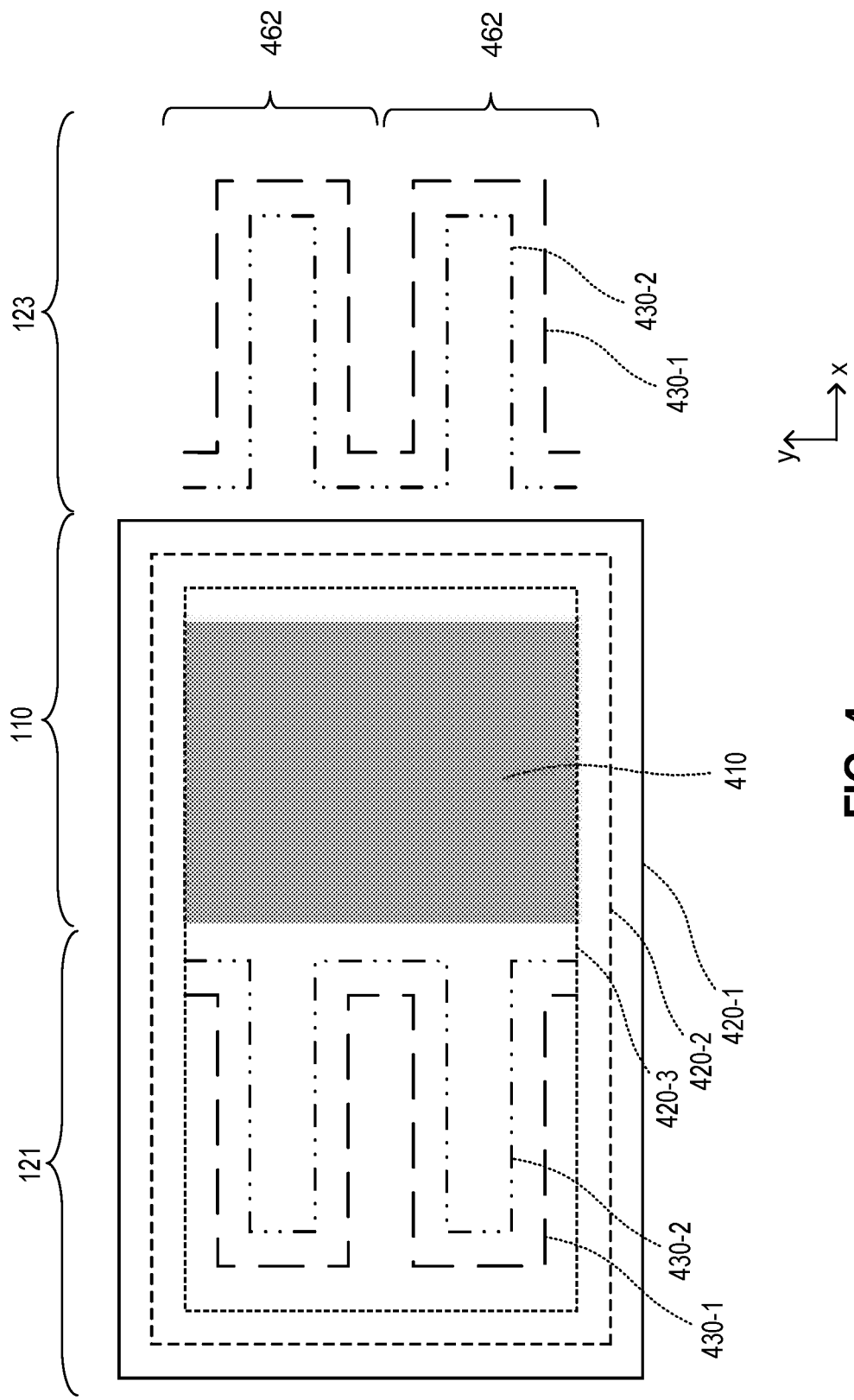
FIGS. 4, 6 and 8 illustrate top views of exemplary masks used in certain fabricating stages of the method shown in FIG. 2 in accordance with some embodiments.

Referring back to FIG. 2, method 200 can proceed to operation S220, in which a top select gate staircase can be formed adjacent to a first staircase region, resulting in a vertical offset in the z-direction between the first staircase region and the second staircase region. FIG. 4 illustrates a top view of exemplary masks used in operations S220 and S230 according to some embodiments, and FIG. 5 illustrates a perspective view a structure 500 of the 3D memory device after operations S220 and S230 according to some embodiments.

Figure 5:
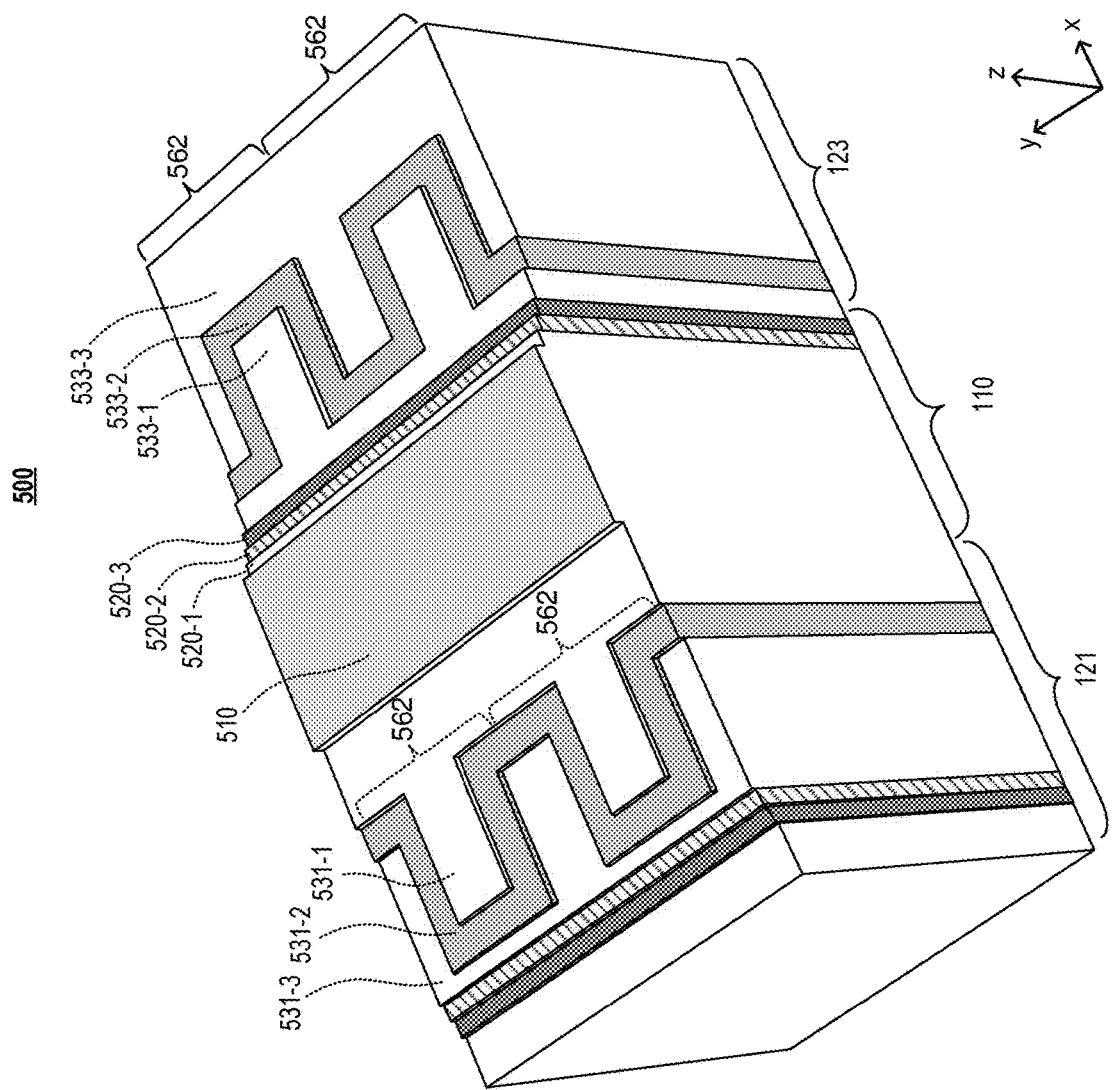
FIGS. 5, 7 and 9 illustrate perspective views of structures of the 3D memory device at certain stages of the method shown in FIG. 2 in accordance with some embodiments, and FIG. 9-Y illustrates a cross sectional view of the structure shown in FIG. 9 along the A1-A2 direction.

As shown in FIG. 5, in some embodiments, operation S220 can include forming a top step 510 in the channel structure region 110. As shown in FIG. 4, a first staircase mask 410 can be used to cover the channel structure region 110 and to expose the first and second staircase regions 123 and 121. In some embodiments, the first staircase mask 410 can include a photoresist or carbon-based polymer material, and can be formed using a patterning process such as lithography. In some embodiments, the first staircase mask 410 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the first staircase mask 410 can include any combination of photoresist and hard mask.

An etching process can be performed to remove at least one alternating dielectric layer pair 156 from the top in both exposed first and second staircase regions 123 and 121. The etch depth is determined by a thickness of the top step 510. In some embodiments, the thickness of the top step 510 can be a thickness of one alternating dielectric layer pair 156. In this example, the etching process for the dielectric layer 150 can have a high selectivity over the sacrificial layer 154, and/or vice versa. Accordingly, an underlying alternating dielectric layer pair 156 can function as an etch-stop layer. And as a result, the top step 510 can be formed in the channel structure region 110, as shown in FIG. 5.

In some embodiments, the top step 510 can be etched using an anisotropic etching such as a reactive ion etch (RIE) or other dry etching processes. In some embodiments, the dielectric layer 152 is silicon oxide. In this example, the etching of silicon oxide can include RIE using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer 154 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer should not be limited by the embodiments of the present disclosure. In some embodiments, after the etching process, the first staircase mask 410 can be removed by using techniques such as dry etching with $O_2$ or $CF_4$ plasma, or wet etching with resist/polymer stripper, for example solvent based chemicals.

As shown in FIG. 5, in some embodiments, operation S220 can further include forming a top select gate (TSG) staircase structure 520 at one edge of the channel structure region 110 adjacent to the first staircase region 123. In some embodiments, the TSG staircase structure 520 can include three steps 520-1, 520-2, and 520-3 that are configured along the x-direction.

As shown in FIG. 4, a second staircase mask 420 can be used to cover the channel structure region 110 and the second staircase region 121 initially, and to expose the first staircase region 123. In some embodiments, the second staircase mask 420 can include a photoresist or carbon-based polymer material, and can be formed using a patterning process such as lithography. In some embodiments, the second staircase mask 420 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the second staircase mask 420 can include any combination of photoresist and hard mask.

The TSG staircase structure 520 can be formed by applying a repetitive etch-trim process (e.g., a three-time etch-trim process) on the film stack 150 in the exposed first staircase region 123 using the second staircase mask 420. The etch-trim process includes an etching process and a trimming process. During the etching process, at least one alternating dielectric layer pair 156 from the top in the exposed first staircase region 123 can be removed. The etch depth is determined by a thickness of each step of the TSG staircase structure 520. In some embodiments, the thickness of each step of the TSG staircase structure 520 can be a thickness of one alternating dielectric layer pair 156. In this example, the etching process for the dielectric layer 152 can have a high selectivity over the sacrificial layer 154, and/or vice versa. Accordingly, an underlying alternating dielectric layer pair 156 can function as an etch-stop layer. And as a result, one step (e.g., 520-1, 520-2, or 520-3) of the TSG staircase structure 520 can be formed during each etch-trim cycle.

In some embodiments, each step (e.g., 520-1, 520-2, or 520-3) of the TSG staircase structure 520 can be etched using an anisotropic etching such as a reactive ion etch (RIE) or other dry etching processes. In some embodiments, the dielectric layer 152 is silicon oxide. In this example, the etching of silicon oxide can include RIE using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer 154 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer should not be limited by the embodiments of the present disclosure.

The trimming process includes applying a suitable etching process (e.g., an isotropic dry etch or a wet etch) on the second staircase mask 420 such that the second staircase mask 420 can be pulled back laterally, in directions in the x-y plane, parallel to the front surface 130f of the substrate 130. From the top-down view in FIG. 4, the second staircase mask 420 can be etched incrementally and inwardly from initial pattern defined by, for example, photoresist from lithography. In this example, the initial edge 420-1 of the second staircase mask 420 can be trimmed incrementally towards a second edge 420-2 and then towards to a third edge 420-3. The lateral pull-back dimension in the x-direction at etch trimming process determines the lateral dimension of each step of the TSG staircase structure 520 in the x-direction. In some embodiments, each step of the TSG staircase structure 520 can have a different or same lateral dimension in the x-direction.

In some embodiments, trimming of the second staircase mask 420 can be isotropic in all directions in the x-y plane. In some embodiments, the lateral dimension of each step of the TSG staircase structure 520 in the x-direction can be between 10 nm and 100 nm. In some embodiments, the trimming process can include dry etching, such as RIE using $O_2$, Ar, $N_2$, etc. After trimming the second staircase mask 420, one portion of the topmost surface of the top step 510 is exposed and the other portion of the top step 510 remains covered by the second staircase mask 420. The next cycle of etch-trim process resumes with the etching process.

By repeating etch-trim process three times, three steps 520-1, 520-2 and 520-3 of the TSG staircase structure 520 can be formed from top to bottom between the top step 510 and the first staircase region 123. During etch-trim process, some of the second staircase mask 420 may be consumed, and the thickness of the second staircase mask 420 may be reduced. After forming the TSG staircase structure 520, the second staircase mask 420 can be removed by using techniques such as dry etching with $O_2$ or $CF_4$ plasma, or wet etching with resist/polymer stripper, for example solvent based chemicals.

Referring back to FIG. 2, method 200 can proceed to operation S230, in which a first division step structure can be formed in the first staircase region and a second division step structure can be formed in the second staircase region. In some embodiments, as shown in FIG. 5, the first division step structure 533 in the first staircase region 123 can be lower than the second division step structure 531 in the second staircase region 121 by three steps due to the TSG staircase structure 520.

In some embodiments, a first staircase division pattern mask 430 can be used to form the first division step structure 531 and the second division step structure 533. As shown in FIG. 4, the first staircase division pattern (SDP) mask 430 can be used to cover the channel structure region 110 and a portion of the two staircase regions 121 and 123 adjacent to the channel structure region 110, and to expose other portions of the two staircase regions 121 and 123. The first staircase division pattern mask 430 can include multiple first division block patterns 462 extended in the x-direction into both staircase regions 121 and 123, and arranged along the y-direction. In FIG. 4, two first division block patterns 462 are shown in each side as an example. In some other embodiments, the first staircase division pattern mask 430 can include a number $X_1$ of first division block patterns 462 in each side, where $X_1$ is an integer equal to or larger than 2 (e.g., 2, 3, 4, etc.).

In some embodiments, the first staircase division pattern mask 430 can include a photoresist or carbon-based polymer material, and can be formed using a patterning process such as lithography. In some embodiments, the first staircase division pattern mask 430 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the first staircase division pattern mask 430 can include any combination of photoresist and hard mask.

The first division step structure 533 and the second division step structure 531 can be formed by applying a two-time etch-trim process on the film stack 150 in the first staircase region 123 and the second staircase region 121 by using the first staircase division pattern mask 430. The etch-trim process includes an etching process and a trimming process. During the etching process, a portion of the film stack 150 with exposed surface can be removed. The etch depth is determined by a thickness of each step of the first division step structure 533 and the second division step structure 531. In some embodiments, the thickness of step can be a thickness of one alternating dielectric layer pair 156. In this example, the etching process for the dielectric layer 152 can have a high selectivity over the sacrificial layer 154, and/or vice versa. Accordingly, an underlying alternating dielectric layer pair 156 can function as an etch-stop layer. And as a result, one step can be formed during each etch-trim cycle.

In some embodiments, the step of the first division step structure 533 and the second division step structure 531 can be etched using an anisotropic etching such as a reactive ion etch (RIE) or other dry etching processes. In some embodiments, the dielectric layer 152 is silicon oxide. In this example, the etching of silicon oxide can include RIE using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer 154 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer should not be limited by the embodiments of the present disclosure.

The trimming process includes applying a suitable etching process (e.g., an isotropic dry etch or a wet etch) on the first staircase division pattern mask 430 such that the first staircase division pattern mask 430 can be pulled back laterally, in directions in the x-y plane, parallel to the front surface 130f of the substrate 130. In some embodiments, the trimming process can include dry etching, such as RIE using $O_2$, Ar, $N_2$, etc. From the top-down view in FIG. 4, the first staircase division pattern mask 430 can be etched inwardly from an initial edge 430-1 towards a final edge 430-2 in both of the first staircase region 123 and the second staircase region 121. The lateral pull-back dimension at etch trimming process determines the lateral dimension of each step of the first division step structure 533 and the second division step structure 531.

In some embodiments, each step of the first division step structure 533 and the second division step structure 531 can have a different or same lateral dimension in the x-direction and/or the y-direction. In some embodiments, trimming of the first staircase division pattern mask 430 can be isotropic in all directions in the x-y plane such that the widths of each step in the x-direction and the y-direction can be the same, and in a range between 10 nm and 100 nm.

By repeating etch-trim process two times, the first division step structure 533 including three steps 533-1, 533-2, and 533-3 can be formed in the first staircase region 123, and the second division step structure 531 including three steps 531-1, 531-2, and 531-3 can be formed in the second staircase region 121, as shown in FIG. 5. The step 533-1 of the first division step structure 531 is lower than the step 531-1 of the second division step structure 533 by three steps. The step 533-2 of the first division step structure 531 is lower than the step 531-2 of the second division step structure 533 by three steps. The step 533-3 of the first division step structure 531 is lower than the step 531-3 of the second division step structure 533 by three steps.

It is noted that, the step difference along the z-direction is determined by number of steps of the TSG staircase structure 520. In some embodiments, if the number of steps of the TSG staircase structure 520 is $X_2$, which is an integer larger or equal to 3. In such case, a same number $X_2$ of steps are formed in each of the first division step structure 533 and the second division step structure 531 respectively. That is, the number of the first steps in the first division step structure 533 and the second division step structure 531 is not limited.

As shown in FIG. 5, the first division step structure 533 and the second division step structure 531 can each include two initial division block structures 562 respectively that are extended along the x-direction and periodically arranged along the y-direction. Each initial division block structure 562 corresponds to one first division block pattern 462, and can be used to form a division staircase block structure in the subsequent processes. It is noted that, the number of initial division block structures 562 in the first division step structure 533 or in the second division step structure 531 can be determined by the number $X_1$ of the first division block patterns 462 of the first staircase division pattern mask 430, such as 2, 3, 4, etc.

During the etch-trim process, some of the first staircase division pattern mask 430 may be consumed, and the thickness of the first staircase division pattern mask 430 may be reduced. After the etch-trim process, the first staircase division pattern mask 430 can be removed by using techniques such as dry etching with $O_2$ or $CF_4$ plasma, or wet etching with resist/polymer stripper, for example solvent based chemicals.

Figure 6:
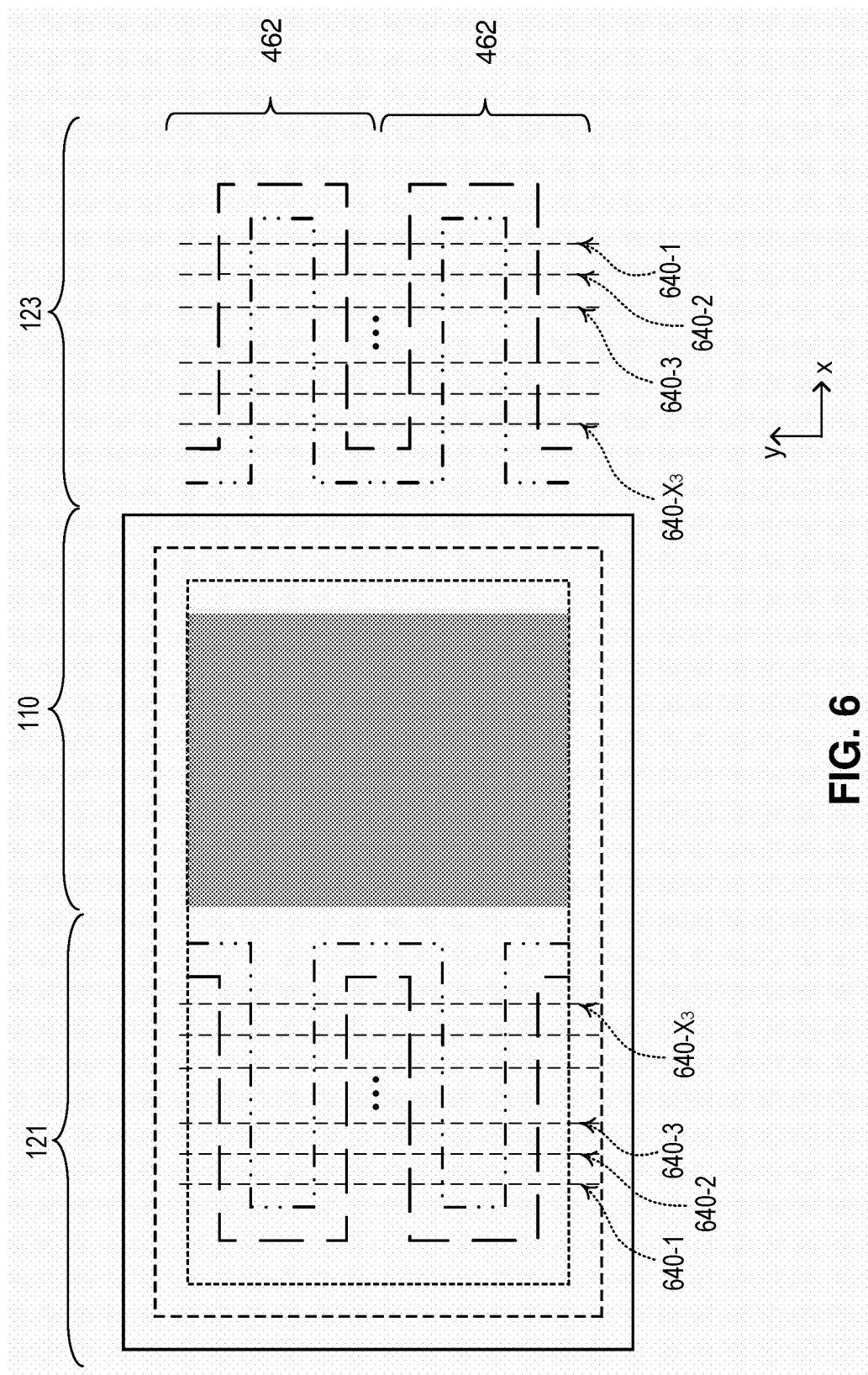

Referring back to FIG. 2, method 200 can proceed to operation S240, in which multiple staircases can be formed in the first division step structure and the second division step structure. FIG. 6 illustrates a top view of exemplary masks used in operations S220-S240 according to some embodiments, and FIG. 7 illustrates a perspective view a structure 700 of the 3D memory device after operation S240 according to some embodiments.

Figure 7:
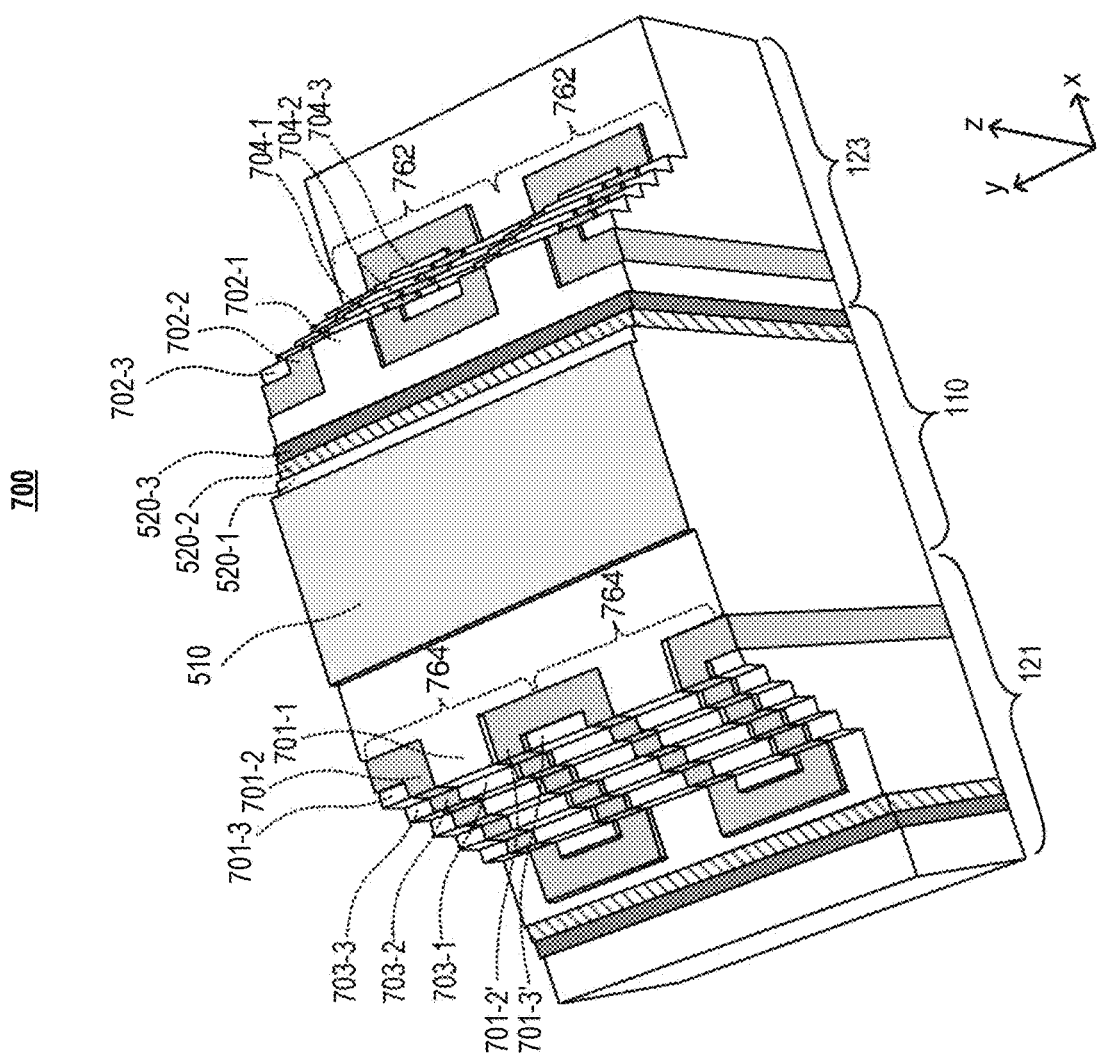

As shown in FIG. 7, the staircases (e.g., 701, 702, 703, 704, etc.) can be arranged along the x-direction. Each staircase can include multiple steps (e.g., 701-1, 701-2, 701-3, etc.) that are arranged along the y-direction. It is noted that, the staircases 701, 702, 703, 704, etc. are arranged alternatively in the first staircase region 123 and the second staircase region 121 respectively. Thus, in some embodiments as shown in FIG. 7, the adjacent staircases (e.g., 701 and 703. 702 and 704, etc.) have a vertical offset in the z-direction of six steps. That is, if the number of steps of the TSG staircase structure 520 is $X_2$, the adjacent steps along the x-direction (e.g., 701-1 and 703-1, 702-2 and 704-2, etc.) have a vertical offset in the z-direction of a number $2X_2$ of steps, and the adjacent steps along the y-direction (e.g., 701-1 and 701-2, 702-2 and 702-3, etc.) have a vertical offset in the z-direction of one step.

In some embodiments, the multiple staircases 701, 702, 703, 704, etc. can be formed by using a third staircase mask 640 disposed over the channel structure region 110 and a portion of the first staircase region 123 and the second staircase region 121. As shown in FIG. 6, the third staircase mask 640 includes two initial edges 640-1 that cover a portion of the first division step structures 533 in the first staircase region 123 and the second division step structures 531 in the second staircase region 121, and both extend in parallel along the y-direction.

In some embodiments, the third staircase mask 640 can include a photoresist or carbon-based polymer material, and can be formed using a patterning process such as lithography. In some embodiments, the third staircase mask 640 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the second staircase mask 420 can include any combination of photoresist and hard mask.

The multiple staircases 701, 702, 703, 704, etc. can be formed by applying a repetitive etch-trim process (e.g., a three-time etch-trim process) on the exposed portion of the first division step structures 533 in the first staircase region 123 and the second division step structures 531 in the second staircase region 121 using the third staircase mask 640. The etch-trim process includes an etching process and a trimming process. During the etching process, a number $2X_2$ of alternating dielectric layer pair 156 from the top of the exposed surfaces of the first division step structures 533 in the first staircase region 123 and the second division step structures 531 in the second staircase region 121 can be removed. The etch depth determines the thickness of each staircase. And as a result, one staircase can be formed in each of the first staircase region 123 and the second staircase region 121 during each etch-trim cycle. Both staircases have a thickness of $2X_2$ times the thickness of one step, and the staircase formed in the first staircase region 123 is lower than staircase formed in the second staircase region 121 by a depth of $X_2$ times the thickness of one step.

In some embodiments, the staircases can be etched using an anisotropic etching such as a reactive ion etch (RIE) or other dry etching processes. In some embodiments, the dielectric layers 152 are silicon oxide films. In this example, the etching of silicon oxide films can include RIE using fluorine-based gases such as carbon-fluorine $(CF_4)$, hexafluoroethane $(C_2F_6)$, $CHF_3$, or $C_3F_6$ and/or any other suitable gases. In some embodiments, the silicon oxide layers can be removed by wet chemistry, such as hydrofluoric acid or a mixture of hydrofluoric acid and ethylene glycol. In some embodiments, a timed-etch approach can be used. In some embodiments, the sacrificial layers 154 are silicon nitride films. In this example, the etching of silicon nitride films can include RIE using $O_2$, $N_2$, $CF_4$, $NF_3$, $Cl_2$, HBr, $BCl_3$, and/or combinations thereof. The methods and etchants to remove a single layer should not be limited by the embodiments of the present disclosure.

The trimming process includes applying a suitable etching process (e.g., an isotropic dry etch or a wet etch) on the third staircase mask 640 such that the third staircase mask 640 can be pulled back laterally, in directions in the x-y plane, parallel to the front surface 130f of the substrate 130. From the top-down view in FIG. 6, the third staircase mask 640 can be etched incrementally and inwardly from initial pattern defined by, for example, photoresist from lithography. In this example, the initial edges 640-1 of the third staircase mask 640 can be trimmed incrementally towards the final edge 640-$X_3$, wherein $X_3$ is an integer that determines a number of staircases can be formed from top to bottom in each of the first staircase region 123 and the second staircase region 121. In the example as shown in FIGS. 6 and 7, $X_3$ equals to six, but it can be any other integer number that is larger than 3. The lateral pull-back dimension in the x-direction at etch trimming process determines the lateral dimension of each staircase in the x-direction. In some embodiments, each staircase can have a different or same lateral dimension in the x-direction.

In some embodiments, trimming of the third staircase mask 640 can be isotropic in all directions in the x-y plane. In some embodiments, the lateral dimension of each staircase in the x-direction can be between 10 nm and 100 nm. In some embodiments, the trimming process can include dry etching, such as RIE using $O_2$, Ar, $N_2$, etc. After trimming the third staircase mask 640, portions of the topmost surface of the first division step structures 533 in the first staircase region 123 and the second division step structures 531 in the second staircase region 121 are exposed and the other portions of the first division step structures 533 in the first staircase region 123 and the second division step structures 531 in the second staircase region 121 remain being covered by the third staircase mask 640. The next cycle of etch-trim process resumes with the etching process.

By repeating etch-trim process three times, a number $X_3$ of staircases can be formed from top to bottom in each of the first staircase region 123 and the second staircase region 121. As such, the multiple initial division block structures 562 become multiple first division block structures 762 in the first staircase region 123 and multiple second division block structure 764 in the second staircase region 121. Each first division block structure 762 or second division block structures 764 includes a number $X_3$ of staircases that are arranged in the x-direction, as shown in FIG. 7. Each staircase can include a number of $(2X_2-1)$ of steps that are distributed in a number $X_2$ of levels respectively, and are symmetrically arranged in the y-direction. In one example as shown in FIG. 7, $X_2$ is three, and staircase 701 include five steps 701-1, 701-2, 701-2', 701-3, and 701-3'. Steps 701-2 and 701-2' are in a same level, and located symmetrically in the y-direction with respect to step 701-1. Similarly, steps 701-3 and 701-3' are in a same level, and located symmetrically in the y-direction with respect to step 701-1.

During etch-trim process, some of the third staircase mask 640 may be consumed, and the thickness of the third staircase mask 640 may be reduced. After forming the multiple staircases in the first staircase region 123 and the second staircase region 121, the third staircase mask 640 can be removed by using techniques such as dry etching with $O_2$ or $CF_4$ plasma, or wet etching with resist/polymer stripper, for example solvent based chemicals.

Figure 8:
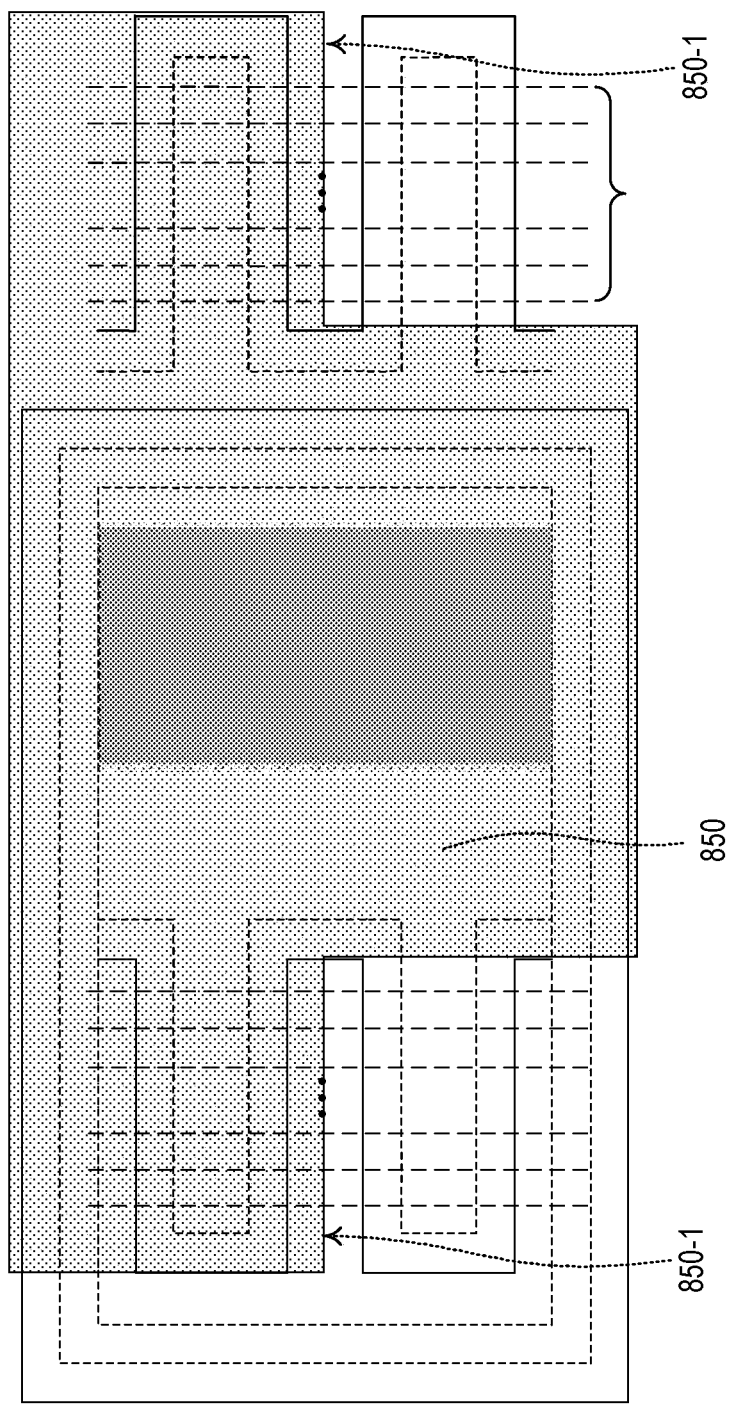
Figure 9:
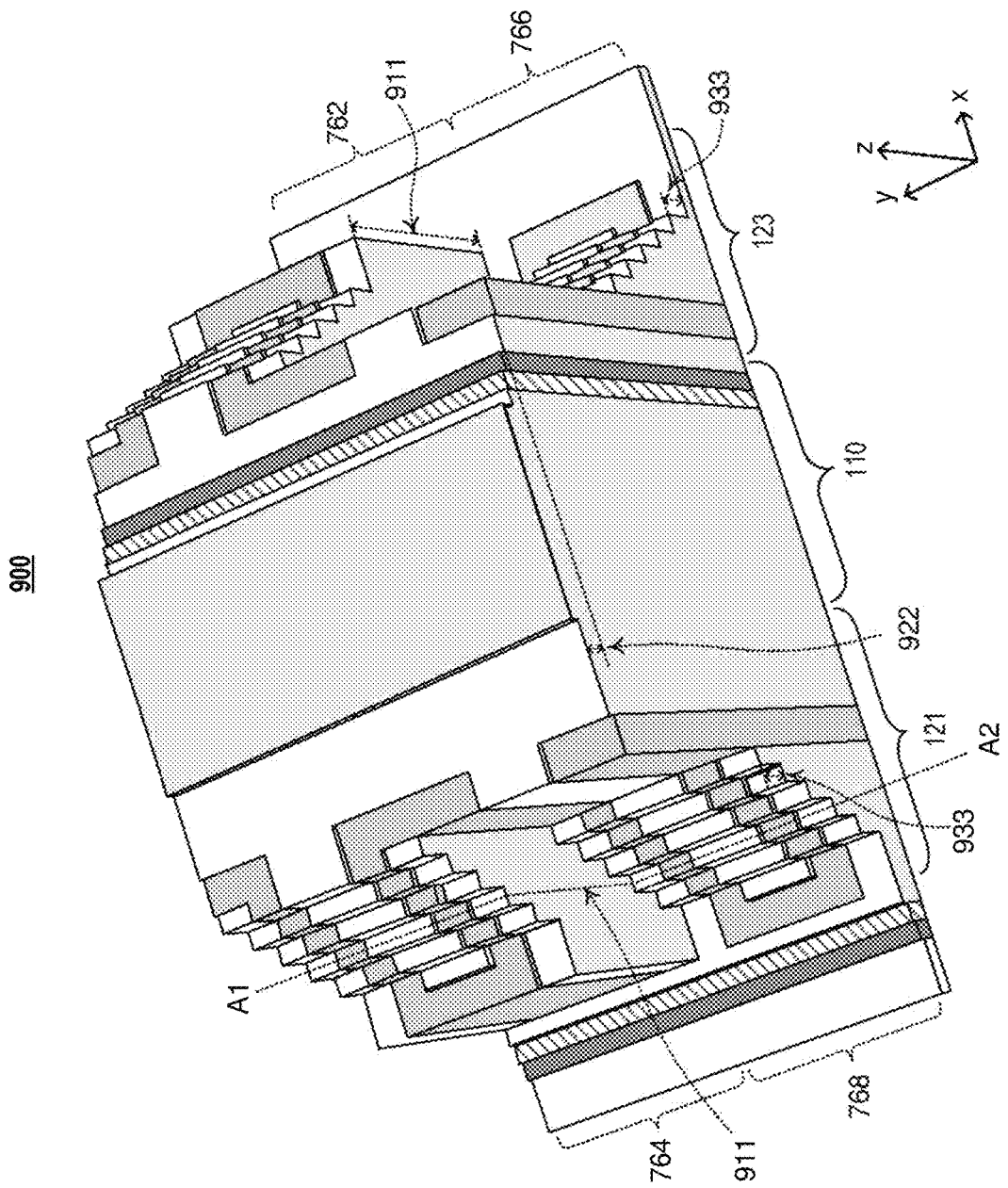

Referring back to FIG. 2, the method 200 can proceed to operation S250, in which multiple division block structures can be formed in the first staircase region and the second staircase region. FIG. 8 illustrates a top view of exemplary masks used in operations S220-S250 according to some embodiments, and FIG. 9 illustrates a perspective view a structure 900 of the 3D memory device after operation S250 according to some embodiments.

In some embodiments, the multiple division block structures can be formed by using a second staircase division pattern mask 850. As shown in FIG. 7, the second staircase division pattern mask 850 can be used to cover the channel structure region 110 and at least one first division block structure 762 in the first staircase region 123 and at least one second division block structure 764 in the second staircase region 121. The second staircase division pattern mask 850 can also expose at least one first division block structure 762 in the first staircase region 123 and at least one second division block structure 764 in the second staircase region 121.

As shown in FIG. 7, the second staircase division pattern mask 850 can have a T-shape with two arms extended in the x-direction to cover the at least one first division block structure 762 in the first staircase region 123 and the at least one second division block structure 764 in the second staircase region 121. That is, the second staircase division pattern mask 850 can have edges 850-1 each being extended along the x-direction and longer than the total width of the multiple staircases in the first division block structure 762 or the second division block structure 764.

In some embodiments, the second staircase division pattern mask 850 can include a photoresist or carbon-based polymer material, and can be formed using a patterning process such as lithography. In some embodiments, the first staircase division pattern mask 430 can also include a hard mask, such as silicon oxide, silicon nitride, TEOS, silicon-containing anti-reflective coating (SiARC), amorphous silicon, or polycrystalline silicon. The hard mask can be patterned using etching process such as reactive-ion-etching (RIE) using $O_2$ or $CF_4$ chemistry. Furthermore, the second staircase division pattern mask 850 can include any combination of photoresist and hard mask.

The third division block structures 766 and the forth division block structures 768 as shown in FIG. 9 can be formed by an etching process to remove a portion of the exposed one first division block structure 762 in the first staircase region 123 and the exposed one second division block structure 764 in the second staircase region 121. The etch depth is determined by a total thickness of the multiple staircases in the first division block structure 762 or the second division block structure 764. In some embodiments, the etch depth can be a number $2X_2X_3$ times the thickness of one alternating dielectric layer pair 156. In the example as shown in FIG. 9, the etch depth can equal to a thickness of 36 steps.

In some embodiments, the etching process can include an anisotropic etching such as a reactive ion etch (RIE) or other dry etching processes. In some embodiments, the dielectric layer 152 is silicon oxide. In this example, the etching of silicon oxide can include RIE using fluorine-based gases such as carbon-fluorine ($CF_4$), hexafluoroethane ($C_2F_6$), $CHF_3$, or $C_3F_6$ and/or any other suitable gases. In some embodiments, the silicon oxide layer can be removed by wet chemistry, such as hydrofluoric acid or a mixture of hydrofluoric acid and ethylene glycol. In some embodiments, a timed-etch approach can be used. In some embodiments, the sacrificial layer 154 is silicon nitride. In this example, the etching of silicon nitride can include RIE using $O_2$, $N_2$, $CF_4$, $NF_3$, $Cl_2$, HBr, $BCl_3$, and/or combinations thereof. The methods and etchants to remove a single layer should not be limited by the embodiments of the present disclosure.

After the etching process, a third division block structure 766 and a forth division block structure 768 can be formed, as shown in FIG. 9. In some other embodiments, more than four division block structures can be formed by using an etch-trim process. For example, if there are three first division block structures 762 in the first staircase region 123 and three second division block structures 764 in the second staircase region 121, the second staircase division pattern mask 850 can firstly cover two first division block structures 762 and two second division block structure 764, and to expose one first division block structures 762 and one second division block structure 764. After one etching process to remove a certain depth of the expose surface to form four division block structures, the second staircase division pattern mask 850 can be trimmed to cover one first division block structures 762 and one second division block structure 764, and to expose two first division block structures 762 and two second division block structure 764. That is, the edges 850-1 can be pulled back laterally in the y-direction to the boundary of next first division block structures 762 and second division block structure 764. A following etching process can form six division block structures.

As such, four or more division block structures can be formed in the first staircase region 123 and the second staircase region 121. In some embodiments, the number of division block structures can be equal to the number $X_1$ of the first division block patterns 462 of the first staircase division pattern mask 430 as described above in connection with FIG. 4. Each division block structure can include a number $X_3$ of staircases that are arranged in the x-direction. Each staircase can include a number of $(2X_2-1)$ of steps that are distributed in a number $X_2$ of levels respectively, and are symmetrically arranged in the y-direction. In one example as shown in FIG. 9, structure 900 of the 3D memory device can include four division block structures 762, 764, 766 and 768. Each division block structure includes six staircases, and each staircase includes five steps that are in three levels.

In some embodiments, the two opposite division block structures that are located at the opposite sides of the channel structure region 110 respectively and arranged in a same position in the y-direction, such as 762 and 764 as shown in FIG. 9, can have a vertical offset 922 in the z-direction that equals to a height of a number $X_2$ of steps (or a number $X_2$ of alternating dielectric layer pairs). In one example as shown in FIG. 9, $X_2$ equals to three, thus one step in the first division block structure 762 is three steps lower than the corresponding step (located in the same position in the y-direction) in the second division block structure 764.

In some embodiments, the two adjacent division block structures that are located at the same side of the channel structure region 110 and arranged in a same position in the x-direction, such as 764 and 768 as shown in FIG. 9, can have a vertical offset 911 in the z-direction that equals to a height of a number $2X_2X_3$ of steps (or a number $2X_2X_3$ of alternating dielectric layer pairs). In one example as shown in FIG. 9, $X_2$ equals to three and $X_3$ equals to six, thus the vertical offset 911 in the z-direction between the second division block structure 764 and the fourth first division block structure 768 is thirty-six steps.

In some embodiments, the multiple steps in the multiple division block structures can be distributed in a number $2X_1X_2X_3$ of different levels, wherein $X_1$ is the number of the division block structures, $X_2$ is the number of steps of the TSG staircase structure, and $X_3$ is the number of staircases in each division block structure. The total number of the multiple steps in the multiple division block structures can be $2X_1(2X_2-1)X_3$.

For example, as shown in FIG. 9, $X_1$ equals to two, $X_2$ equals to three, and $X_3$ equals to six. Thus, the total number of levels of the steps in the multiple division block structures 762, 764, 766 and 768 is 72. If the steps including the top step and the steps of the TSG staircase structure are numbered from top to bottom (two steps in a same level have a same number), the top step is No. 1; the TSG staircase structure includes steps No. 2-4; the second division block structure 764 include the steps No. 5-7, 11-13, 17-19, 23-25, 29-31, and 35-37; the first division block structure 762 include the steps No. 8-10, 14-16, 20-22, 26-28, 32-34 and 38-40; the forth division block structure 768 include the steps No. 41-43, 47-49, 53-55, 59-61, 65-67 and 71-73; and the third division block structure 766 include the steps No. 44-46, 50-52, 56-58, 62-64, 68-70 and 74-76.

Fabrication of the 3D memory device can be resumed after forming the staircase structures with multiple divisions, for example, forming channel holes, slit structures, replacement gates, and contact structures. Related processes and techniques for these subsequent structures are known to a person skilled in the art and therefore are not included in the present disclosure.

Accordingly, various embodiments of three-dimensional memory device and methods of making the same are described in the present disclosure. In the disclosed 3D memory device, multiple division block structures are formed on both sides of the channel structure region, and arranged along a second direction. Each division block structure includes multiple staircases arranged in a first direction. Each staircase includes multiple steps arranged in the second direction. As such, the 3D space of the disclosed 3D memory device can be efficiently used to form a large number of steps, resulting a smaller die size, a higher device density, and improved performance compared with other 3D memory devices. Further, during the fabricating process of the disclosed 3D device, the number of masks to be used to form the multiple steps can be reduced, and the number of trimming processes can be also reduced, thereby increasing the number of etching wafers per hour (WPH). Further, forming multiple division block structures using a staircase division pattern mask can avoid using etch-trim process to form steps at a lower portion of the 3D memory device, thus reducing a thickness requirement of the photoresists layer in the etch-trim process.

One aspect of the present disclosure provides a three-dimensional (3D) memory device, comprising: a channel structure region including a plurality of channel structures; a first staircase structure in a first staircase region including a plurality of division block structures arranged along a first direction on a first side of the channel structure, and a second staircase structure in a second staircase region including a plurality of division block structures arranged along the first direction on a second side of the channel structure. A first vertical offset (e.g., 911 in FIG. 9) defines a boundary between adjacent division block structures. Each division block structure includes a plurality of staircases arranged along a second direction that is different from the first direction. Each staircase includes a plurality of steps arranged along the first direction.

In some embodiments, the 3D memory device further comprises a top select gate staircase structure including a number $X_2$ of steps arranged along the second direction in the channel structure region.

In some embodiments, a second vertical offset (e.g., 922 in FIG. 9) between the plurality of division block structures in the first staircase region and the plurality of division block structures in the second staircase region equals to $X_2$ times a thickness of one step.

In some embodiments, a third vertical offset (e.g., 933 in FIG. 9) between adjacent staircases equals to $2X_2$ times the thickness of one step.

In some embodiments, each staircase includes a number $(2X_2-1)$ of steps distributed symmetrically in $X_2$ levels.

In some embodiments, the first staircase structure and the first staircase structure include a plurality of dielectric/conductive layer pairs; and each step includes a dielectric/conductive layer pair.

In some embodiments, the first direction and the second direction are perpendicular to each other and are in a plane parallel to an interface surface of the dielectric/conductive layer pair.

In some embodiments, a number of the plurality of division block structures in each of the first staircase region and the second staircase region is $X_1$; and a number of the plurality of staircases in each division block structure is $X_3$.

In some embodiments, the first vertical offset between adjacent of division block structures equals to $2X_2X_3$ times a thickness of one step.

In some embodiments, a total number of the plurality of steps in the first staircase structure and the second staircase structure is $2X_1(2X_2-1)X_3$; and the plurality of steps are distributed in a number of $2X_1X_2X_3$ different levels.

In some embodiments, $X_1$ is two and $X_2$ is three.

Another aspect of the present disclosure provides a method for forming a three-dimensional (3D) memory device, comprising: forming a film stack with a plurality of dielectric layer pairs on a substrate; forming a channel structure region in the film stack including a plurality of channel structures; and forming a first staircase structure in a first staircase region and a second staircase structure in a second staircase region, each of the first staircase structure and the second staircase structure including a plurality of division block structures arranged along a first direction. A first vertical offset defines a boundary between adjacent division block structures, and each division block structure includes a plurality of staircases arranged along a second direction that is different from the first direction. Each staircase includes a plurality of steps arranged along the first direction.

In some embodiments, the method further comprises forming a top select gate staircase structure including a number $X_2$ of steps arranged along the second direction in the channel structure region.

In some embodiments, forming the first staircase structure and the second staircase structure includes: forming a plurality of initial division step structures in the first staircase region and the second staircase region, each initial division step structure including the number $X_2$ of steps arranged along the first direction, wherein each step includes a dielectric layer pair.

In some embodiments, forming the plurality of initial division step structures includes: disposing a first staircase division pattern mask with a number $2X_1$ of first division block patterns on the film stack; and using an etch-trim process based on the first staircase division pattern mask to form the plurality of initial division step structures.

In some embodiments, forming the first staircase structure and the second staircase structure further includes: forming a number $X_3$ of staircases in each of the initial division step structures to form a number $X_1$ of division block structures in each of the first staircase region and the second staircase region.

In some embodiments, forming the staircases includes: using an etch-trim process such that the staircases are formed along the second direction. The first direction and the second direction are perpendicular to each other and are in a plane parallel to an interface surface of the dielectric/conductive layer pair.

In some embodiments, an etching depth in each cycle of the etch-trim process is $2X_2$ times a thickness of one step.

In some embodiments, forming the first staircase structure and the second staircase structure further includes: disposing a second staircase division pattern mask to cover at least two division block structures and expose at least two division block structures; and etching the exposed at least two division block structures by a depth equal to $2X_2X_3$ times the thickness of one step.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
   forming a film stack with a plurality of dielectric layer pairs on a substrate;
   forming a channel structure region in the film stack including a plurality of channel structures;
   forming a first staircase structure in a first staircase region and a second staircase structure in a second staircase region; and
   forming a plurality of division block structures arranged along a first direction and in each of the first and second staircase structures, comprising forming a first vertical offset defining a boundary between adjacent division block structures, wherein each division block structure includes a plurality of staircases arranged along a second direction that is different from the first direction, each staircase including a plurality of steps arranged along the first direction.

2. The method of claim 1, further comprising:
   forming a top select gate staircase structure including a number X2 of steps arranged along the second direction in the channel structure region.

3. The method of claim 2, wherein forming the first staircase structure and the second staircase structure includes:
   forming a plurality of initial division step structures in the first staircase region and the second staircase region, each initial division step structure including the number X2 of steps arranged along the first direction, wherein each step includes a dielectric layer pair.

4. The method of claim 3, wherein forming the plurality of initial division step structures includes:
   disposing a first staircase division pattern mask with a number 2X1 of first division block patterns on the film stack; and
   using an etch-trim process based on the first staircase division pattern mask to form the plurality of initial division step structures.

5. The method of claim 3, wherein forming the first staircase structure and the second staircase structure further includes:
   forming a number X3 of staircases in each of the initial division step structures to form a number X1 of division block structures in each of the first staircase region and the second staircase region.

6. The method of claim 5, wherein forming the staircases includes:
   using an etch-trim process such that the staircases are formed along the second direction;
   wherein the first direction and the second direction are perpendicular to each other and are in a plane parallel to an interface surface of the dielectric layer pair.

7. The method of claim 6, wherein:
   an etching depth in each cycle of the etch-trim process is 2X2 times a thickness of one step.

8. The method of claim 5, wherein forming the first staircase structure and the second staircase structure further includes:
   disposing a second staircase division pattern mask to cover at least two division block structures and expose at least two division block structures; and
   etching the exposed at least two division block structures by a depth equal to 2X2X3 times the thickness of one step.

9. The method of claim 5, wherein X1 is two and X2 is three.

10. The method of claim 1, wherein forming the first vertical offset comprises etching the first and second staircase structures using an etch-trim process.

11. A method for forming a three-dimensional (3D) memory device, comprising:
    forming a dielectric stack on a substrate, wherein the dielectric stack comprises first and second plurality of dielectric layers alternatingly stacking in a vertical direction;
    forming a top select gate staircase to divide the dielectric stack into a first region and a second region;
    forming a plurality of channel structures in the first region;
    forming first and second division block structures in the second region and arranging in a first direction, wherein each of the first and second division block structures comprises a plurality of staircase structures arranging in a second direction, and wherein each of the plurality of staircase structures comprises a plurality of steps arranging in the first direction; and
    forming a vertical offset in the staircase structure between the first and second division block structures.

12. The method of claim 11, wherein forming the first and second division block structures comprises performing an etch-trim process to form the plurality of steps.

13. The method of claim 12, wherein forming the vertical offset comprises:
    covering the first division block structure using a mask; and
    etching, along a vertical direction, a portion of the second division block structures.

14. The method of claim 11, further comprising:
    forming a third division block structure in the second region and adjacent to the second division block structure; and
    forming another vertical offset between the third and second division block structures.

15. The method of claim 14, wherein forming the vertical offset and the another vertical offset comprises performing an etch-trim process.

16. The method of claim 11, further comprising replacing the second plurality of dielectric layers by a plurality of conductive layers.

17. The method of claim 11, wherein the first direction is perpendicular to the second direction.

18. A method for forming a three-dimensional (3D) memory device, comprising:
   forming a dielectric stack on a substrate, wherein the dielectric stack comprises a plurality of alternating dielectric layer pairs stacking in a vertical direction;
   forming, by performing a first etch-trim process on the dielectric stack, a staircase structure comprising a plurality of staircases arranging in a first horizontal direction, wherein each of the plurality of staircases comprises a plurality of steps arranging in a second horizontal direction; and
   forming, by performing a second etch-trim process on the staircase structure, a plurality of vertical offsets dividing the staircase structure into a plurality of division block structures arranging in the second horizontal direction, wherein each of the plurality of vertical offsets is greater than a vertical offset between adjacent steps of the plurality of steps.

19. The method of claim 18, wherein forming the staircase structure comprises:
   covering, using a mask, a portion of the dielectric stack; and
   repeatedly performing etching an exposed portion of the dielectric stack by a depth and pulling the mask laterally along the first horizontal direction by a distance, wherein:
      the depth equals to a height of each of the plurality of staircases; and
      the distance equals to a lateral dimension of each of the plurality of staircases.

20. The method of claim 18, wherein forming the plurality of vertical offsets comprises:
   covering, using a mask, a portion of the staircase structure; and
   repeatedly performing etching an exposed portion of the staircase structure by a depth and trimming the mask laterally along the second horizontal direction by a distance, wherein:
      the depth equals to a height of each of the plurality of vertical offsets; and
      the distance equals to a lateral dimension of each of the plurality of division block structures.

\* \* \* \* \*